United States Patent [19]

Lechaton et al.

[11] Patent Number: 4,661,832
[45] Date of Patent: Apr. 28, 1987

[54] TOTAL DIELECTRIC ISOLATION FOR INTEGRATED CIRCUITS

[75] Inventors: John S. Lechaton, Wappingers Falls; Shashi D. Malaviya, Fishkill; Dominic J. Schepis, Wappingers Falls; Gurumakonda R. Srinivasan, Poughkeepsie, all of N.Y.

[73] Assignee: International Business Machines Corporation, Armonk, N.Y.

[21] Appl. No.: 826,938

[22] Filed: Feb. 6, 1986

Related U.S. Application Data

[60] Continuation of Ser. No. 665,824, Oct. 29, 1984, abandoned, which is a division of Ser. No. 393,932, Jun. 30, 1982, Pat. No. 4,502,913.

[51] Int. Cl.$^4$ .......................................... H01L 27/12
[52] U.S. Cl. ...................................... 357/49; 357/54; 357/34; 357/35; 357/47
[58] Field of Search ................... 357/49, 34, 47, 54, 357/54 N, 50, 35

[56] References Cited

U.S. PATENT DOCUMENTS

| | | | |
|---|---|---|---|
| 3,947,299 | 3/1976 | Weisland et al. | 357/47 X |
| 3,966,577 | 6/1976 | Hochberg | 357/49 X |
| 4,044,452 | 8/1977 | Abbas et al. | 357/49 X |
| 4,196,440 | 4/1980 | Anantha et al. | 357/49 X |
| 4,214,315 | 7/1980 | Anantha et al. | 357/49 X |
| 4,271,583 | 6/1981 | Kahng et al. | 357/49 X |
| 4,287,526 | 9/1981 | Sakuma | 357/49 X |
| 4,353,086 | 10/1982 | Jaccodine et al. | 357/49 X |
| 4,371,886 | 2/1983 | Hartman et al. | 357/49 X |
| 4,424,621 | 1/1984 | Abbas et al. | 357/49 X |
| 4,502,913 | 3/1985 | Lechaton et al. | 357/49 X |

Primary Examiner—Andrew J. James
Assistant Examiner—William A. Mintel
Attorney, Agent, or Firm—T. Rao Coca; George O. Saile

[57] ABSTRACT

A fully isolated dielectric structure for isolating regions of monocrystalline silicon from one another and method for making such structure are described. The structure uses a combination of recessed oxide isolation with pairs of parallel, anisotropic etched trenches which are subsequently oxidized and filled to give complete dielectric isolation for regions of monocrystalline silicon. The anisotropic etching preferably etches a buried N+ sublayer under the mnocrystalline silicon region and then the trench structure is thermally oxidized to consume the remaining N+ layer under the monocrystalline region and to fully isolate the monocrystalline silicon region between pairs of such trenches.

12 Claims, 10 Drawing Figures

TOTAL DIELECTRIC ISOLATION FOR INTEGRATED CIRCUITS

This application is a continuation of application Ser. No. 665,824 filed Oct. 29, 1984, now abandoned, which is a divisional application of Ser. No. 393,932, filed Jun. 30, 1982, now U.S. Pat. No. 4,502,913.

FIELD OF THE INVENTION

The invention is directed to a fully isolated dielectric structure for isolating regions of monocrystalline silicon from one another and methods for making this structure.

BACKGROUND OF THE INVENTION

In the monolithic integrated circuit technology, it is usually necessary to isolate various active and passive devices from one another in the integrated circuit structure. These devices have been isolated by back-biasing PN junctions, partial dielectric isolation and complete dielectric isolation. The dielectric materials used have been silicon dioxide, glass, etc. The preferred isolation for these active devices and circuits is complete dielectric isolation. However, such structures have been very difficult to fabricate.

One form of complete dielectric isolation is taught by the J. G. Kren et al., U.S. Pat. No. 3,419,956 and P. P. Castrucci et al., U.S. Pat. No. 3,575,740, both of which are assigned to the present assignee. The method of manufacturing this form of dielectric isolation involves the formation of a grid of channels in a monolithic silicon semiconductor wafer. A layer of silicon dioxide or other dielectric material is then formed on the surface of the wafer. Polycrystalline silicon is then grown on top of the silicon dioxide or other dielectric material in a substantial thickness. The monolithic silicon is then etched or lapped away until the grid of channels which are silicon dioxide or other dielectric material is reached. The remaining portions of the monocrystalline silicon wafer are now isolated from one another by the grid of dielectric material. Semiconductor devices and circuits can now be formed in the isolated monocrystalline silicon regions.

The A. K. Hochberg, U.S. Pat. No. 3,966,577 describes a variation of the above described patents for forming dielectric isolated semiconductor regions especially adapted for the construction of an integrated circuit on an epitaxial wafer. A layer of silicon dioxide is grown on the back-side of the wafer and a layer of polycrystalline silicon is deposited onto the silicon dioxide layer. An aluminum oxide mask is formed defining a plurality of grooves around active semiconductor regions within the epitaxial silicon layer. The grooves are formed by a sputter etching process. Silicon dioxide is thermally grown within each of the grooves exposed by the sputter etching process to dielectrically isolate the active semiconductor regions after which semiconductor devices may be formed in each of the active semiconductor regions.

A still further process for forming complete dielectric isolation is described in the H. B. Pogge, U.S. Pat. No. 4,104,090 which is assigned to the present assignee. This process utilizes an anodized porous silicon technique to form the dielectric isolation on one side of the semiconductor device. The starting silicon wafer is typically predominantly P with a P+ layer thereon. A P or N layer is deposited over the P+ layer such as by epitaxial growth. The surface of the silicon wafer is oxidized and suitable openings are formed using conventional lithography. Openings are formed in the silicon dioxide layer to define the regions to be etched in the epitaxial silicon layer down to the P+ layer. Reactive ion etching is accomplished at least down to the P+ region. The structure is then subjected to the anodic etching technique which preferentially attacks the P+ layer to form a porous silicon throughout the P+ layer. The structure is then placed in a thermal oxidation ambient until the porous silicon layer has been fully oxidized to silicon dioxide. The openings through the surface silicon layer are filled up by a silicon dioxide or like insulator to isolate the P or N monocrystalline surface regions from one another.

The J. A. Bondur et al. U.S. Pat. No. 4,104,086 assigned to the same assignee as the present invention describes a method for forming partial dielectric isolation with filled grooves or depressions of dielectric material. In the preferred embodiment of this invention, it was necessary to reactive ion etch the grooves or depressions through a N+ region which was eventually to become the subcollector region for bipolar devices. This presented difficulty because the N+ region would undercut the portion of the monocrystalline material above the N+ region during certain reactive ion etching conditions. This was undesirable in the context of this invention. A subsequent N. G. Anantha et al. U.S. Pat. No. 4,196,440 assigned to the same assignee as the present invention found this undercutting in the N+ layer an advantage and utilized it as partial isolation for a lateral PNP or NPN device.

SUMMARY OF THE PRESENT INVENTION

In accordance with the present invention a fully isolated dielectric structure for isolating regions of monocrystalline silicon from one another and method for making such structure is described. The structure uses a combination of recessed oxide isolation with pairs of parallel, anisotropic etched trenches which are subsequently oxidized and filled to give complete dielectric isolation for regions of monocrystalline silicon. The anisotropic etching preferably etches a buried N+ sublayer under the monocrystalline silicon region and then the trench structure is thermally oxidized to consume the remaining N+ layer under the monocrystalline region and to fully isolate the monocrystalline silicon region between pairs of such trenches.

The resulting structure can be further processed to form an integrated circuit having semiconductor devices therein which are fully isolated from other such devices. The integrated circuit structure is a silicon semiconductor body composed of a substrate, and epitaxial layer on the substrate and a N+ type layer at the interface of said substrate and the epitaxial layer. Regions of the epitaxial layer are completely isolated from other such regions by recessed oxide isolation extending from the surface of the silicon body into the body, insulator filled trenches extending between the recessed oxide isolation and from the surface of the silicon body into the body, and oxidized portions of the N+ type layer between the filled trenches and the recessed oxide isolation. The semiconductor devices are located in at least certain regions and means are provided for contacting the elements of the devices and connecting them with other devices in other such regions to form the integrated circuit structure. The structure is particularly valuable for bipolar semiconductor devices or metal oxide semiconductor field effect transistor devices.

The method for fabricating a totally dielectric isolated integrated circuit in a monolithic silicon body is described. A monocrystalline silicon body is provided which has a monocrystalline silicon region on major surface of the body dielectrically isolated at the surface from other such regions by two parallel strips of recessed oxide dielectric material. The silicon body has an N+ sub-region spaced from the major surface of the body and extending parallel to the major surface at least substantially across said entire silicon body and below the dielectric strips. Parallel trenches are anisotropically etched within the monocrystalline silicon region between the strips of dielectric material and through the N+ sub-region. The etch rate of the anisotropically etching process is adjusted to cause a preferential etching of the N+ subregion so that a portion of the N+ region is removed and monocrystalline silicon remains above this removed portion. The spacing of the trenches is chosen such that the preferential etching of the N+ sub-region from each trench closely approaches the other trench. The exposed silicon surfaces of the trenches are thermally oxidized until the N+ sub-region between the trenches is totally oxidized to silicon dioxide. The trenches are then filled with dielectric material to produce the totally dielectrically isolated silicon region separated from other such regions. Semiconductor devices are formed in the totally dielectric isolated silicon regions and the elements of the devices are contacted in that region and are connected to similar devices in other such regions to form the integrated circuit structure.

DESCRIPTION OF THE PREFERRED EMBODIMENTS

Figure 1:
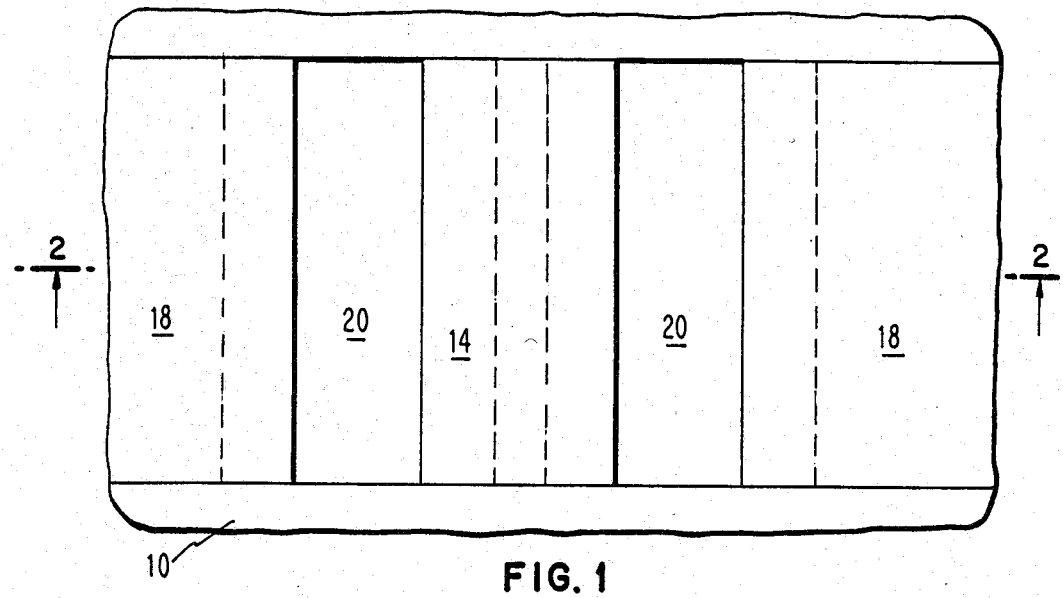
FIGS. 1 through 7 schematically illustrate one process embodiment of the present invention for manufacturing bipolar integrated circuits.
Figure 2:
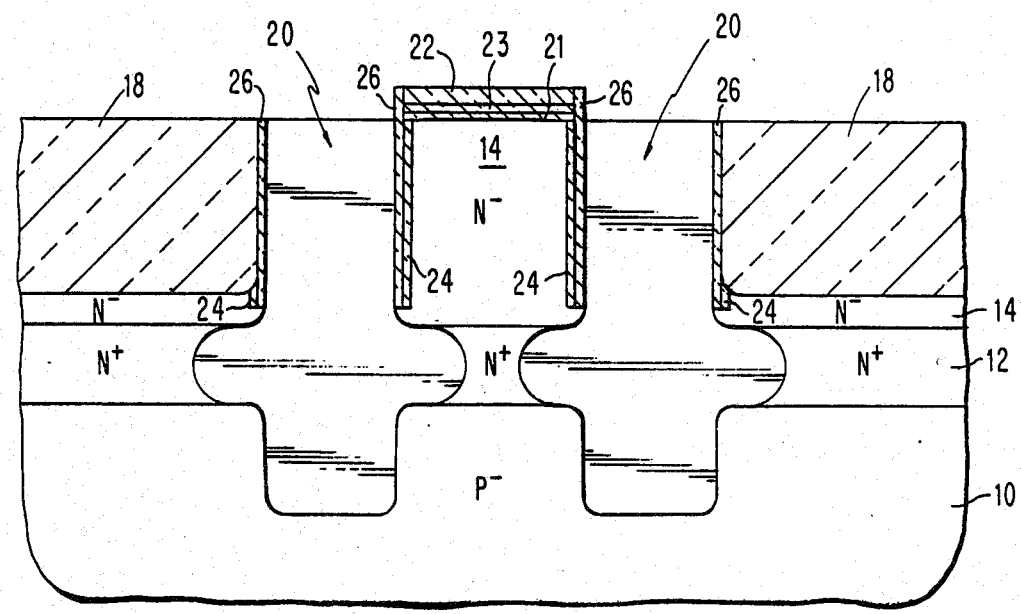

Referring now more particularly to FIGS. 1 and 2 there are shown a greatly enlarged top view of the integrated circuit structure of the first embodiment in FIG. 1 and a cross-sectional view along 2:2 of FIG. 1 in FIG. 2. The semiconductor wafer or substrate 10 is composed preferably of monocrystalline silicon and is, for example, P− monocrystalline silicon material. The P− substrate 10 has a subcollector N+ region 12 therein. An epitaxial N layer 14 is then grown on top of the substrate. These processes are standard processes in the formation of, for example, NPN bipolar transistors. The substrate is typically <100> crystallographic oriented silicon having a resistance in the order of 10 to 20 ohm/cm. The subcollector diffusion is typically formed using arsenic having a surface concentration of about $10^{20}$ atoms/cm$^2$. The epitaxial growth process to form the layer 14 may be done by conventional techniques, such as the use of silicon tetrachloride/hydrogen or silane/hydrogen mixtures at temperatures between about 1,000° C. to 1,150° C. During the epitaxial growth, the dopant in the N+ layer moves into the epitaxial layer to complete the formation of the subcollector layer 12. The thickness of the epitaxial layer for highly dense integrated circuits is of the order of 1 to 3 micrometers.

The next series of steps involves the formation of the recessed oxide isolation regions 18 or an alternative isolation structure. There are various methods for fabricating the recessed oxide isolation regions 18. One process for accomplishing this isolation is described in the Magdo et al. patent application, Ser. No. 150,609, filed June 7, 1971 or Peltzer U.S. Pat. No. 3,648,125. In that patent application or patents the processes for forming the recessed oxide isolation is given in detail. Briefly, the process involves, following the formation of the N-epitaxial layer, thermally oxidizing the epitaxial surface in an oxygen ambient with or without water vapor atmosphere at a temperature of about 1,000° C. to a thickness of about 200 nanometers of silicon dioxide. Silicon nitride of a thickness of about 150 nanometers is deposited by chemical vapor deposition over the silicon dioxide layer. The desired recessed oxidation isolation areas are defined using conventional lithography and etching techniques. The structure is now thermally oxidized with or without a prior silicon etching step and the desired thickness of recessed oxide isolation 18 is formed. The prior etching step results in a more planar structure after the oxidation step.

The next series of steps are utilized to form the trenches 20. The silicon nitride and silicon dioxide layers are stripped from the major surfaces of the silicon body following the formation of the recessed oxide isolation 18. The epitaxial layer 14 is thermally oxidized to form silicon dioxide layer 21 a thickness of about 200 nanometers. A 50 to 100 nanometer CVC silicon nitride layer 23 is then deposited over the thermally grown silicon dioxide layer 21. A chemical vapor deposited silicon dioxide layer 22 of about 0.5 $\mu$ micrometers in thickness is then deposited over the CVD deposited silicon nitride layer 23. Standard lithography and etching is utilized to define the trench areas in the silicon dioxide and nitride layers by reactive ion etching such as by use of carbon tetrafluoride/hydrogen down to the epitaxial layer. Any resist layer is then removed from the surface. Using the silicon dioxide layer 22 as the mask the structure is exposed to a reactive ion etching ambient for silicon etching.

The trenches may be formed in a 1 or 2-step process. A 2-step process is illustrated in FIG. 2. In the 2-step process the initial etching extends to just above the N+ layer 12. Following the first trench etching step, the structure is subjected to a thermal oxidation ambient and the trench is oxidized to form a silicon dioxide layer 24. The thickness of layer 24 is about 100 nanometers. A layer 26 of silicon nitride is deposited by conventional chemical vapor deposition. The thickness of the silicon nitride layer is between about 50 to 100 nanometers. Reactive ion etching using an ambient of CF$_4$—H$_2$ or CHF$_3$ gases are used to remove the silicon dioxide and silicon nitride to form sidewalls around the dense regions. This also leaves a silicon dioxide/silicon nitride diffusion barrier 24, 26 on the trench sidewalls. This diffusion barrier protects the future device regions from the subsequent oxidation. The second step of reactive ion etching of the silicon trench 20 continues through the N+ sublayer 12. The silicon dioxide and silicon nitride mask layers should not be totally consumed during this reactive ion etching. The N+ layer 12 is laterally undercut at this step as illustrated in FIG. 2.

There are several gases which are effective in etching the silicon trench and simultaneously causing the preferential lateral undercutting of N+ buried layer 12. The examples of these gases are $CCl_2F_2$, $Cl_2/Ar$ and $CBrF_3$. However the preferred reactive ion etching gas is $CCl_2F_2$. This gas is preferred for several reasons which include: (1) The gas produces more lateral etching of the N+ layer 12 at lower pressures and at higher flow rates than the other gases. This feature is important in terms of avoiding what has been termed "black silicon" which is a rough silicon surface due to the masking effect of a redeposited reaction product during the reactive etching process. (2) The gas does not cause the deposits on the wall of the reactive ion etching which occurs in the case of $Cl_2/Ar$ and hence allows faster pump-down of the etching tool with no adverse effect on the vacuum pump. (3) The gas has no serious silicon dioxide undercutting. The operating conditions for reactive ion etching are as follows:

The range of operating conditions are between about 75 to 100 m Torr pressure, a power density of 0.15-0.3 watts/$cm^2$ and a flow rate of between 20-25 SCCM. The above conditions are used in conjunction with a fused silica product plate. It is important to avoid silicon loading, that is, the placing of excessive bare silicon wafers on the product plate to maximize the N+ lateral etching.

The structure is subjected to an additional arsenic diffusion into the silicon which has been exposed during this second reactive ion etching process to complete the formation of the trench 20. The arsenic diffuses into the undercut region of the N+ layer 12 and into the epitaxial layer and ultimately will form the N+ subcollector 30 after the subsequent oxidation step. The planned base and emitter regions are protected from this diffusion by the diffusion barrier made up of layers 24 and 26.

The single step process is used for the formation of field effect transistors and like devices where the N+ subcollector 30 is not required. It therefore eliminates the need for protective layers 24 and 26 as well as the arsenic diffusion into the undercut regions. The reactive etching of the trench can therefore be completed in one step due to the elimination of layers 24 and 26 and their subsequent processes.

Figure 3:
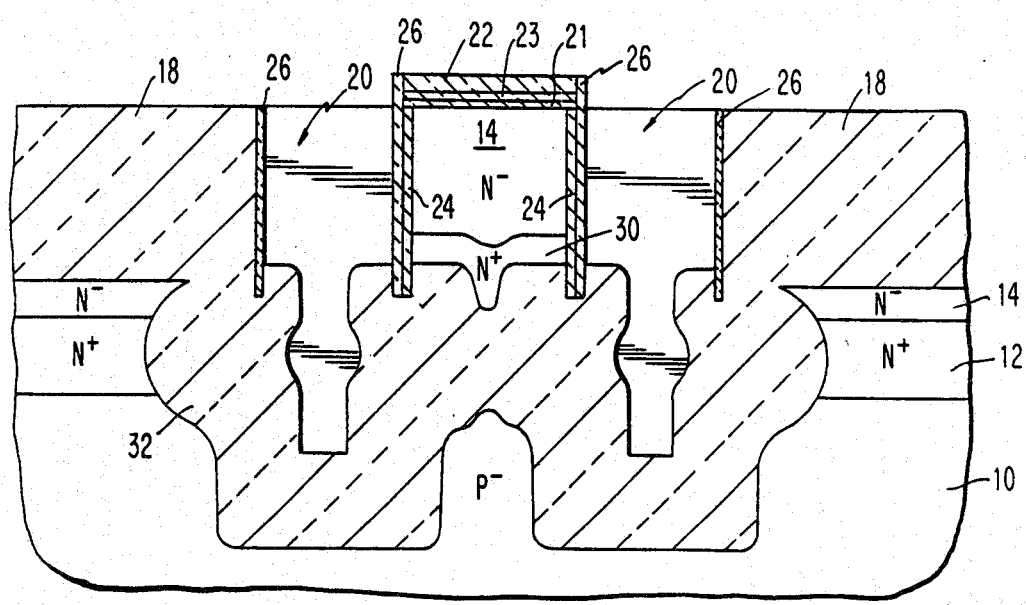

The exposed silicon in the trenches 20 is now reoxidized in a thermal oxidizing ambient of oxygen with or without the presence of water vapor. A thermal oxidation temperature of about 1,100° C. is used for this reoxidation to minimize stresses in silicon during oxidation process. This oxidation will also complete the total dielectric isolation of the device as shown in the FIG. 3 cross-sectional view with the formation of the underlying isolation region 32. A high pressure oxidation can also be used to minimize the diffusion of the arsenic subcollector 30. The top silicon nitride layer and the silicon nitride layer on the sidewall of the trench 26 prevents oxidation of the device area as shown in FIG. 3.

Figure 4:
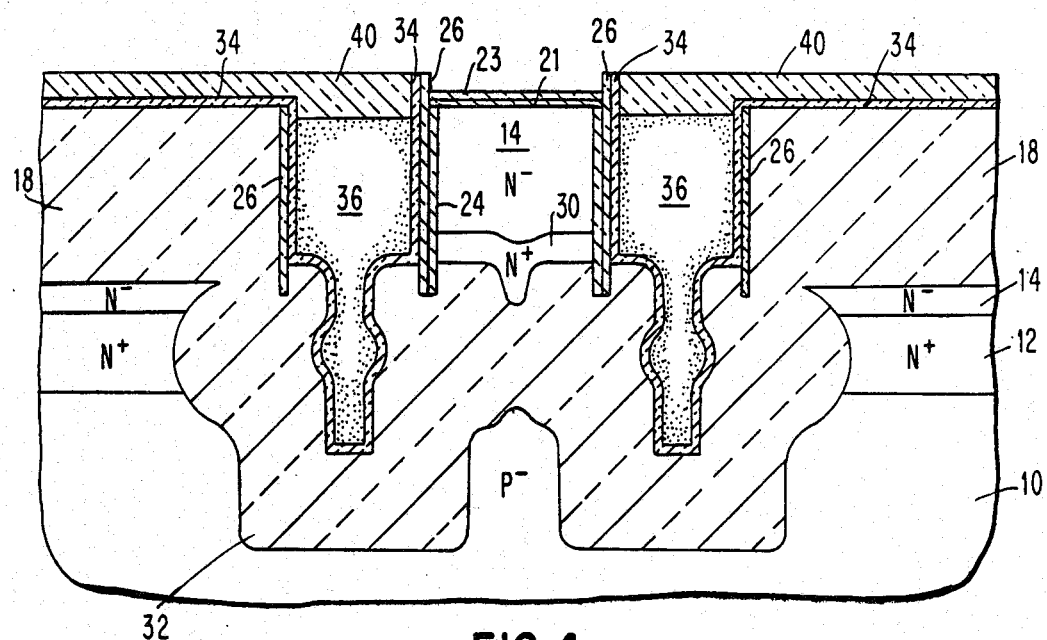

Now referring to FIG. 4 the next series of steps are utilized to fill the trenches 20 with electrically isolation material. The first step is to blanket deposit a layer 34 of chemical vapor deposited silicon nitride between about 50 to 100 nanometers for additional passivation of the trench surfaces. The trench is then completely filled with polycrystalline silicon using a conventional chemical vapor deposition process which is as follows: The polycrystalline silicon is deposited at the low pressure of 390 milliTorr. The chemical vapor deposition has a flow of 90 SCCM and at a deposition temperature of 625° C. The planarization of the polycrystalline silicon is done by etching back the polycrystalline silicon in $Cl_2$—Ar ambient or $SF_6$—$Cl_2$ in Helium gas in an RIE system to the silicon nitride surface 34 over the device area.

After the planarization of the polycrystalline silicon to the silicon dioxide layer 22 over the device area, a photoresist block-out mask in conjunction with a wet etch is used to remove the silicon dioxide layer 22 over the device area. It may be necessary to use a silicon nitride etch to remove any of the residual silicon nitride 34 prior to etching silicon dioxide 22 to the silicon nitride surface 26. A silicon dioxide layer 40 is formed over the polycrystalline silicon by thermally oxidizing the polycrystalline silicon in a suitable oxidation ambient at a temperature of 1,050° C. to a thickness of from 0.25 $\mu$m to 0.4 micrometers. The result of this process series of steps is shown in FIG. 4. It is important to oxidize the polycrystalline silicon to completion over the ROI 18. The oxidation is present to prevent shorting between the polysilicon and the first metal lands.

Alternatively, the trench could be filled with CVD silicon dioxide, however, in this case a polycrystalline silicon buffer layer is preferable as an end point stop during the $SiO_2$ planarization. This CVD polycrystalline silicon should be deposited prior to the trench etching in the initial film stack. After the planarization of the silicon dioxide the polycrystalline silicon buffer layer can be removed with a wet chemical etch. At this point, the total dielectric isolation is complete. Conventional techniques can now be employed to form the base, emitter, and collector reach-through regions in the device region. The following procedure forms an NPN transistor. Similar conventional techniques can be used to form other devices such as PNP transistors, Schottky barrier diodes, resistors, and field effect transistors.

Figure 5:
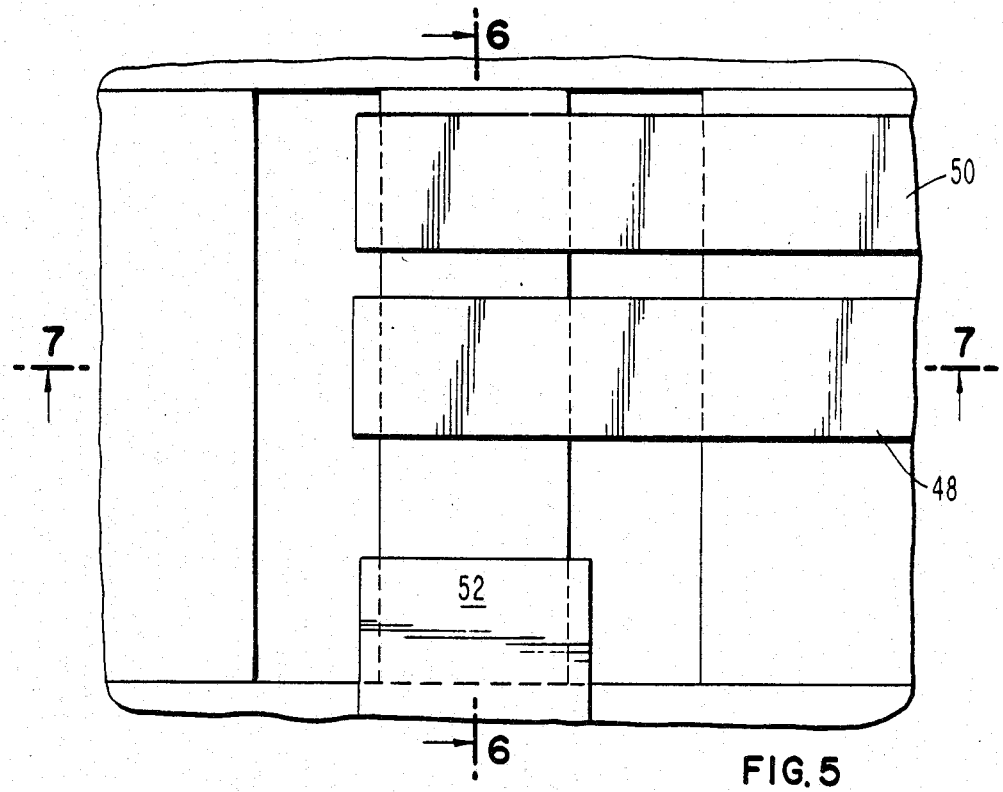
Figure 6:
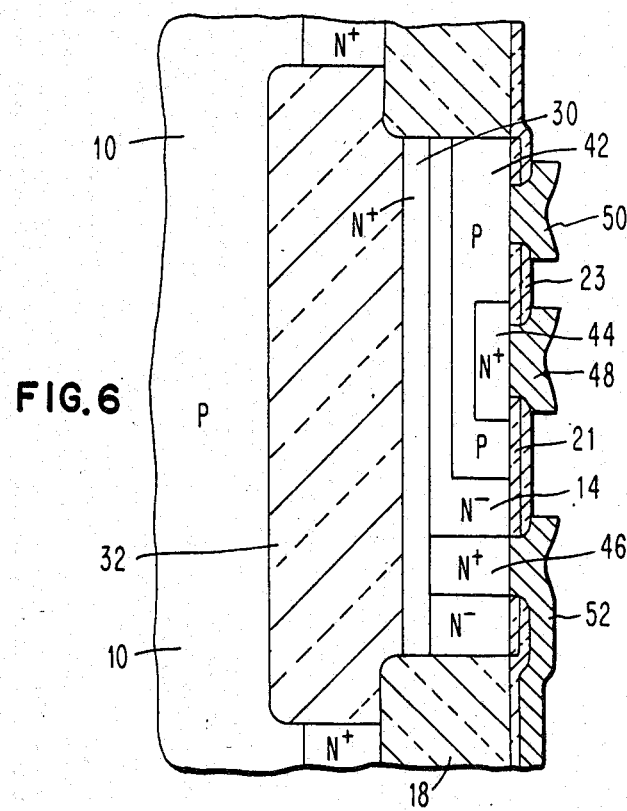
Figure 7:
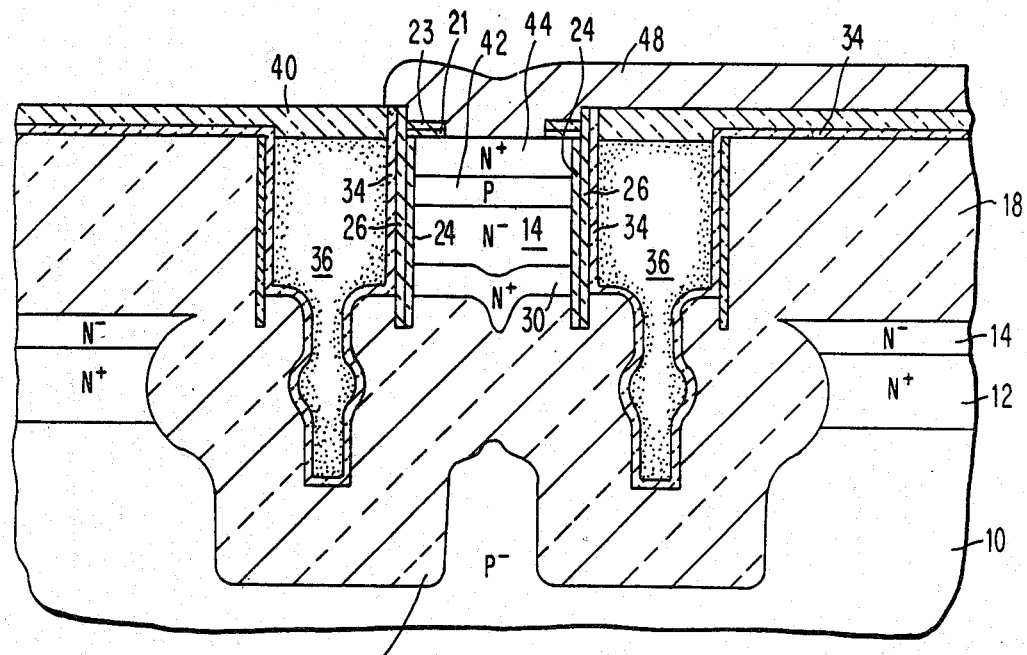

Referring now to FIGS. 5, 6 and 7 there is shown a completed semiconductor integrated circuit with electrical contacts to the elements of one semiconductor device in the integrated circuit. FIG. 5 is the top view of the structure with cross-sections taken along 6:6 and 7:7 and are shown respectively in FIGS. 6 and 7 to show the basic structure of this bipolar embodiment.

Lithography and etching techniques were used to form the surface insulator layers into a diffusion or ion implantation mask for the formation of the P base region 42. Boron or other suitable dopant is either diffused or ion implanted through windows in the mask to form base region 42. Where ion implantation is utilized, a screen silicon dioxide layer (not shown) is utilized as is conventional to trap heavy impurity ions to reduce defects in the implanted region.

The surface is reoxidized by thermal oxidation and the desired openings for emitter and collector reach-through regions are made by standard lithography and etching techniques. Then the emitter region 44 and the collector reach-through region 46 may be formed by conventional diffusion or ion implantation techniques.

To make electrical contacts to the regions of the NPN bipolar device in the monocrystalline silicon layer, a suitable ohmic contact metal is evaporated or deposited by other means onto the upper surface of the structure after openings have been formed to the appropriate regions. A typical contact of metal is aluminum or aluminum/copper. However, other well-known materials in the art can be used such as platinum, palladium and the like. In the latter instance the platinum and palladium and the like would be heated to form a platinum or palladium silicide to form ohmic contact, then aluminum or aluminum/copper conductor metal would be formed thereover. Lithography and etching techniques are utilized to form the desired conductive lines on the surface of the semiconductor structure. These conductors then connect with other semiconductor devices to form the desired integrated circuit. The emitter conductor is shown at 48, the base conductor is shown at 50, and the collector conductor is shown at 52, in FIGS. 5, 6, and 7.

Figure 8:
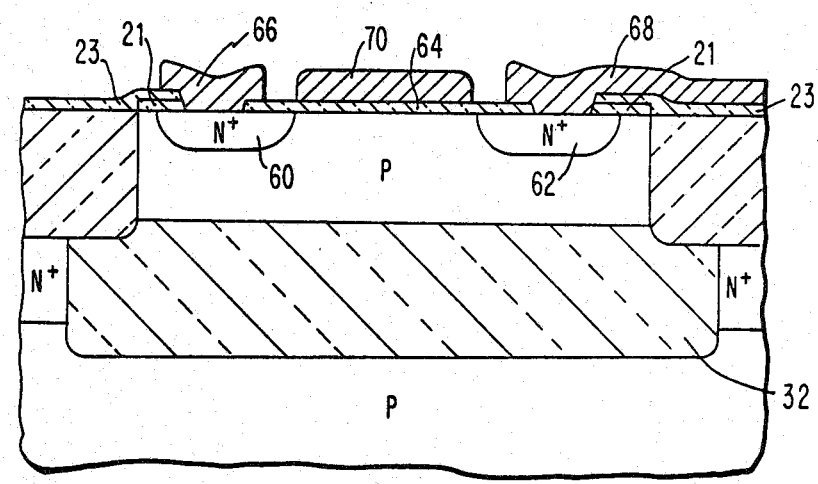
FIG. 8 illustrates a vertical cross-section of a field effect transistor manufactured according to a second embodiment which is a modification of the first embodiment.

The second embodiment illustrated by FIG. 8 shows a metal oxide silicon field effect transistor structure. This embodiment is made in an identical manner to that of the FIGS. 1 through 7 embodiment up to the formation of the desired semiconductor device. For a P channel field effect transistor device an N− epi is used and for the N type channel device a P− epi is used. All like numbers indicate substantially identical structures in the Figs. of the bipolar and field effect transistor embodiments. The source and drain regions 60 and 62 are formed by either conventional diffusion or ion implantation techniques. An N channel device is being formed in FIG. 8 so the N+ region 60 and 62 are formed as a source and drain by use of a suitable dopant such as phosphorous or arsenic. A suitable gate dielectric region such as silicon dioxide of between about 15 to 50 nanometers in thickness 64 is formed over the channel region. The metallization is then formed as was described in the first embodiment to form the source and drain contacts 66 and 68 respectively and the gate electrode 70. Formation of other types of MOS field effect transistors using self-alignment techniques are obvious alternatives to the briefly described field effect transistor fabrication process above. In all cases, it is desirable to electrically connect the substrate 10 to a suitable electrical potential.

EXAMPLE

Silicon wafers having an epitaxial layer of 1.5 micrometers thickness and an N+ layer of the interface of the substrate and epitaxial layer were the substrate for this example. The surface was oxidized thermally to a thickness of 80 nanometers silicon dioxide, followed by about 1.0 micrometers of CVD silicon dioxide. Lithography and etching techniques were used to form openings in the areas of the silicon dioxide layer where trenches were desired in the wafers. The trenches were then etched in a reactive ion etching ambient with the gases in the ambient being $CCl_2F_2$/oxygen to a depth of 4.0 micrometers. The exposed silicon was thermally oxidized to a thickness of 500 nanometers.

Figure 9:
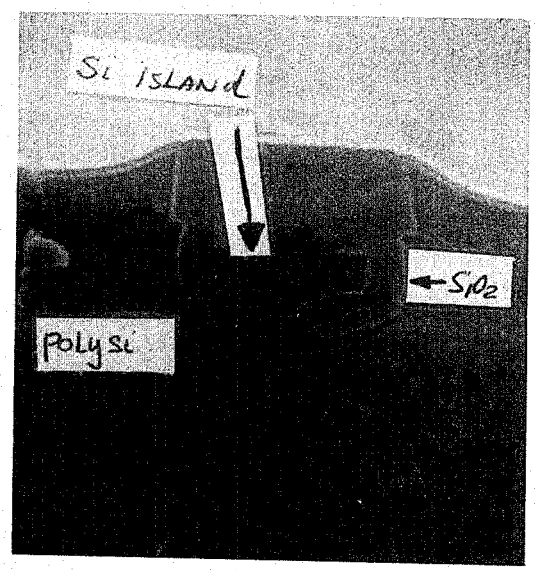
FIGS. 9 and 10 are photographs made by scanning electron microscopy of actual monocrystalline silicon regions completely dielectrically isolated from other such silicon regions made according to the process of the present invention.
Figure 10:
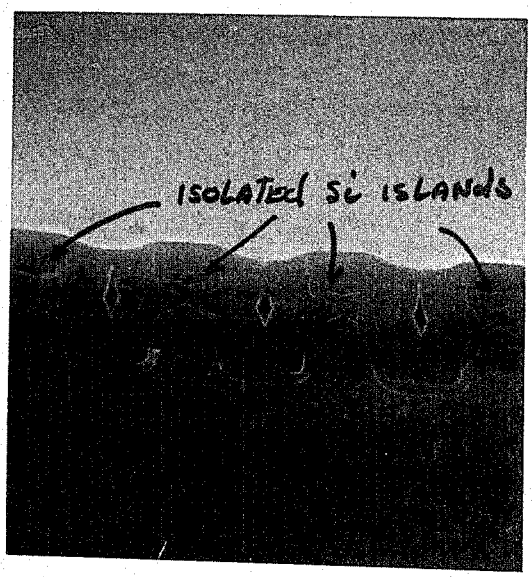

Conditions used were $CCl_2F_2$ and $O_2$ gas ambient at 16 SCCM of $CCl_2F_2$ and 4 SCCM of $O_2$. The power was 375 watts which is 0.33 watts/cm². The pressure was 75 milliTorr and the product plate was fused silica. The thermal oxidation ambient was oxygen at 1,050° C. Next, the trenches were filled with chemically vapor deposited polycrystalline silicon to a thickness of 4.0 micrometers and etched back to the silicon dioxide surface in a $Cl_2$/Ar reactive ion etching process. The conditions for the process were as follows: 90 SCCM, 390 m Torr in $SiH_4$ at 625° C. The etch back was preformed in a diode reactive ion etcher or reactive sputter etcher in an ambient of $Cl_2$—Ar at 40 watts (0.16 watts/cm²), a pressure of 10 m Torr, and a flow of 20 SCCM, employing 7% $Cl_2$. A thin layer of silicon nitride was deposited over the top surface of the polycrystalline silicon to avoid etching of the polycrystalline silicon during the silicon delineation in 99% nitric acid and 1% hydrofluoric acid. FIGS. 9 and 10 show scanning electron microscope picture photographs of the delineated structures. FIG. 9 shows a single isolated silicon region surrounded by a dielectric isolation (magnification 10,000×). FIG. 10 shows a series of four isolated silicon regions (magnification 3,000×). The apparent voids in FIG. 9 in N+ region is due to the enhanced etching of the N+ sublayer in the silicon etch for the scanning electron microscope delineation. The various parts of the structures are labeled in the Figs. The voids at the center of the filled trenches in FIG. 10 are due to the N+ undercutting during the $CCl_2F_2/O_2$ etching and the conformal nature of the polycrystalline silicon filling. These voids are common to trenches filled with polycrystalline silicon and they do not cause any adverse problem. The mask silicon dioxide used for this experiment was excessively thick, but can be made thinner where desired.

While the invention has been particularly shown and described with reference to the preferred embodiment thereof, it will be recognized by those skilled in the art that the foregoing and other changes in form and details may be made without departing from the spirit and scope of the invention. For example, the substitution of N type regions for P type regions to form opposite type devices such as PNP devices rather than NPN and P channel field effect transistor devices instead of N channel field effect transistor devices can obviously be done. Also, the isolated single crystal region formed by this technique can be used to fabricate other types of bipolar devices such as the polysilicon base, for example, as illustrated in H. S. Bhatia et al., U.S. Pat. No. 4,236,294 and self-aligned metal, for example, as seen in patent application Ser. No. 167,184 filed July 8, 1980 entitled "self-aligned Metal Process for Integrated Circuit Metallization" by G. R. Goth et al.

What is claimed is:

1. An integrated circuit having semiconductor devices therein which are completely isolated from other semiconductor devices comprising:

a silicon semiconductor body composed of a substrate and an epitaxial silicon layer of a predetermined thickness on said substrate;

regions of said epitaxial layer are completely isolated from other completely isolated epitaxial layer regions by a combination of recessed oxide isolation regions of a thickness substantially that of said epitaxial layer extending from the surface of said silicon body and fully recessed into said epitaxial layer, insulator filled trenches extending between said recessed oxide isolation regions and from the surface of said silicon body into said body, said trenches being contiguous with said recessed oxide isolation regions and having a depth exceeding the thickness of said epitaxial layer and an oxide layer between said filled trenches and said recessed oxide isolation regions and extending to a depth exceeding said trench depth;

said semiconductor devices located in certain of said completely isolated epitaxial layer regions; and means for electrically contacting said semiconductor devices and connecting them with other semiconductor devices in said other completely isolated epitaxial layer regions on said substrate to form said integrated circuit.

2. The integrated circuit of claim 1 wherein said substrate is P type and said epitaxial layer is N-type.

3. The integrated circuit of claim 2 wherein said semiconductor devices in said certain of said completely isolated epitaxial silicon layer regions are vertical NPN transistors each composed of an N type collector, P type base and N type emitter located within a given completely isolated epitaxial silicon layer region.

4. The integrated circuit of claim 1 wherein said epitaxial layer is P type.

5. The integrated circuit of claim 4 wherein said semiconductor devices in said certain of said completely isolated epitaxial layer regions are field effect transistors.

6. The integrated circuit of claim 1 wherein said recessed oxide isolation is composed of silicon dioxide and said insulator filled trenches are composed of silicon dioxide, silicon nitride and polycrystalline silicon.

7. The integrated circuit of claim 1 wherein the spacing between the nearest edges of said trenches is between 1 to 4 micrometers.

8. The integrated circuit of claim 7 wherein the said trenches are between about 1 to 2.5 micrometers in width.

9. A total dielectrically isolated semiconductor island structure in a semiconductor substrate comprising:
a silicon semiconductor substrate;
an epitaxial silicon island extending to a depth from a surface portion of said substrate;
an insulator-filled trench extending from the surface of said substrate and surrounding said island, said trench having a depth exceeding the depth of the island and enclosing an oxide region directly below said island;
a thick oxide isolation region recessed below the surface of said substrate and surrounding said trench, the thickness of said thick oxide exceeding the depth of said island;
a relatively thick oxide layer below and contiguous with said oxide region, said trench and said oxide isolation region,
whereby said island structure is completely isolated from the remainder of the silicon substrate and suitable for locating a semiconductor device theron.

10. The structure as recited in claim 9 wherein said insulator-filled trench is composed of silicon dioxide, silicon nitride and polycrystalline silicon.

11. The structure as recited in claim 9 wherein said substrate is P type and said silicon island is N type.

12. The structure as recited in claim 9 wherein said island is P type.

* * * * *